Jan. 27, 1970 B. W. MATTHEWS 3,492,626

CONNECTORS FOR USE WITH PRINTED CIRCUITS

Filed Jan. 22, 1968

INVENTOR
B. W. Matthews
BY Havrack, Downing & Seebold
ATTORNEYS

United States Patent Office 3,492,626

Patented Jan. 27, 1970

3,492,626

CONNECTORS FOR USE WITH PRINTED CIRCUITS

Benjamin William Matthews, Small Heath, Birmingham, England, assignor to Joseph Lucas (Industries) Limited, Birmingham, England, a British company Filed Jan. 22, 1968, Ser. No. 699,681

Claims priority, application Great Britain, Jan. 30, 1967, 4,385/67

Int. Cl. H05k *1/07;* H01r *11/22*

U.S. Cl. 339—17 3 Claims

ABSTRACT OF THE DISCLOSURE

A connector for use with printed circuits comprises a conductive member which is adapted at one end to be electrically connected with a conductive lead. At its other end the member includes a substantially flat base portion and a pair of side walls upstanding from opposite sides of the base portion which are deformed to define with the base, a socket. A pressure plate is positioned in the socket and the arrangement is such that a printed circuit having an exposed conductive area thereon can be inserted between the base and the pressure plate so that the conductive member constitutes an electrical connection between the printed circuit and the lead.

This invention relates to connectors for use with printed circuits particularly for interconnecting flexible printed circuits and conductive leads.

A connector according to the invention comprises a conductive member adapted at one end to be electrically connected with a conductive lead, the member including at its other end a substantially flat base portion, a pair of side walls upstanding from opposite sides of the base portion and deformed to define therewith a socket and a pressure plate in the socket, the arrangement being such that in use a printed circuit having exposed conductive areas thereon can be inserted between the base and the pressure plate so that the conductive member constitutes an electrical connection between the printed circuit and the lead.

Figure 1:
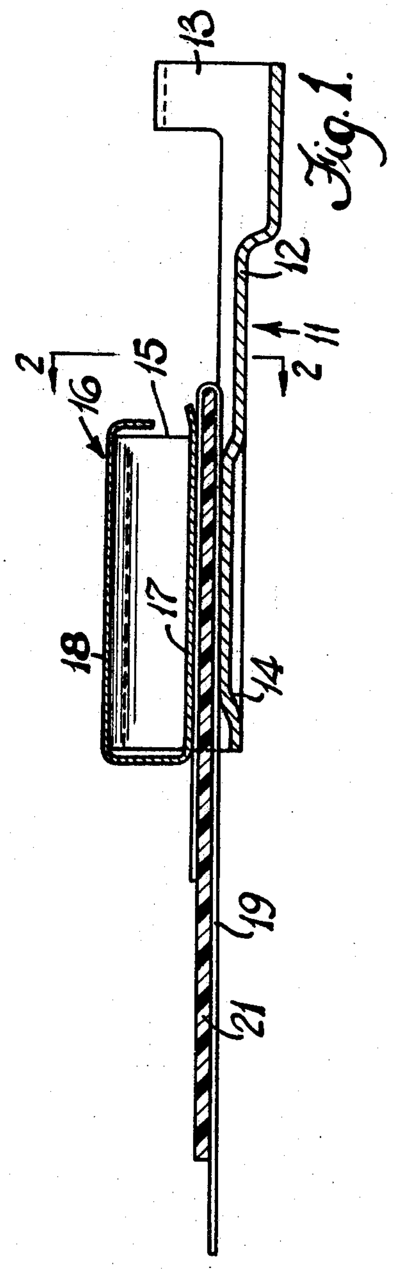
Figure 2:
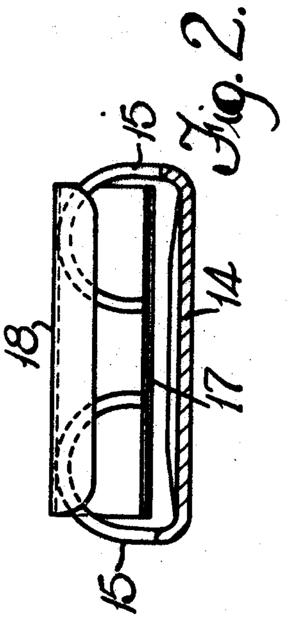

One example of the invention is illustrated in the accompanying drawings wherein;

FIGURE 1 is a sectional view of a connector having a flexible printed circuit engaged therewith and, FIGURE 2 is a sectional view on the line 2—2 in FIGURE 1 with the flexible printed circuit omitted for clarity.

Referring to the drawings the connector 11 comprises a conductive member 12 having at one end thereof a pair of deformable tabs 13 which in use are bent to grip and make electrical contact with a conductive lead. The opposite end of the member 12 includes a generally flat base portion 14 having upstanding from opposite sides thereof a pair of side walls 15. The walls 15 are rolled over until their upper edges extend towards and are spaced from the base portion 14 by a small distance.

One limb 17 of a generally U shaped conductive member 16 is engaged with the member 12 and extends generally parallel with the base portion 14 between the base portion 14 and the walls 15. The other limb 18 of the member 16 extends over the walls 15 and its free end is bent to engage behind the walls 15 to prevent inadvertent removal of the member 16.

In use a flexible printed circuit 19 having exposed conductive areas thereon is supported on a rigid blade 21 and the blade 21 is inserted between the limb 17 and the base portion 14, the arrangement being such that the resilience of the walls 15 urges the limb 17 firmly into contact with the base portion 14 thereby gripping the flexible printed circuit between the limb 17 and the portion 14. The conductive areas on the flexible printed circuit engage the base portion 14 and the limb 17 and are thereby electrically connected with a conductive lead engaged with the other end of the member 12.

The blade 21 could for example be constituted by an integral part of a moulded synthetic resin facia panel of a road vehicle.

It will be appreciated that the flexible printed circuit 19 and the blade 21 could be replaced by a printed circuit board.

The limb 17 of the member 16 prevents the edges of the walls 15 cutting into the printed circuit when the printed circuit is engaged with the connector and furthermore the limb 17 serves to conduct heat, which is generated in use, away from the printed circuit.

Having thus described my invention what I claim as new and desire to secure by Letters Patent is:

1. An electrical connector comprising a conductive member adapted at one end to be electrically connected to a conductive lead, the member including at its other end a substantially flat base portion, a pair of side walls upstanding from opposite sides of the base portion and deformed to define therewith a socket; a pressure plate in the socket; and a blade member for insertion into said socket, having an exposed printed circuit area, the blade member being inserted, in use, into the socket between the base and said pressure plate which is urged into contact with the printed circuit by the resilience of the deformed side walls so that the conductive lead is electrically connected to the printed circuit through the conductive member.

2. A connector as claimed in claim 1 wherein the printed circuit is a flexible printed circuit and is mounted on the blade member.

3. A connector as claimed in claim 2 wherein said blade member is an integral part of a road vehicle facial panel.

References Cited

UNITED STATES PATENTS

| | | |
|---|---|---|
| 2,591,009 | 4/1952 | Riche. |
| 2,980,878 | 4/1961 | Swengel. |
| 3,030,603 | 4/1962 | Olsson. |
| 3,084,302 | 4/1963 | Braeutigam. |
| 3,086,193 | 4/1963 | Berg. |
| 3,159,447 | 12/1964 | Crimmins et al. |

FOREIGN PATENTS

| | | |
|---|---|---|
| 539,811 | 9/1941 | Great Britain. |

MARVIN A. CHAMPION, Primary Examiner

PATRICK A. CLIFFORD, Assistant Examiner

U.S. Cl. X.R.

339—256, 258